(12) United States Patent
Sugihara et al.

(10) Patent No.: US 10,340,948 B2
(45) Date of Patent: Jul. 2, 2019

(54) TRANSMITTER AND RECEIVER, AND METHOD OF VARYING A CODING RATE

(71) Applicants: Kenya Sugihara, Chiyoda-ku (JP); Yoshikuni Miyata, Chiyoda-ku (JP); Wataru Matsumoto, Chiyoda-ku (JP)

(72) Inventors: Kenya Sugihara, Chiyoda-ku (JP); Yoshikuni Miyata, Chiyoda-ku (JP); Wataru Matsumoto, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 14/762,606

(22) PCT Filed: Feb. 8, 2013

(86) PCT No.: PCT/JP2013/053047
§ 371 (c)(1),
(2) Date: Jul. 22, 2015

(87) PCT Pub. No.: WO2014/122772
PCT Pub. Date: Aug. 14, 2014

(65) Prior Publication Data
US 2015/0365105 A1 Dec. 17, 2015

(51) Int. Cl.
*H03M 13/11* (2006.01)
*H03M 13/00* (2006.01)
(Continued)

(52) U.S. Cl.
CPC ..... *H03M 13/1102* (2013.01); *H03M 13/005* (2013.01); *H03M 13/036* (2013.01);
(Continued)

(58) Field of Classification Search
CPC .......... H03M 13/1102; H03M 13/036; H03M 13/1154; H03M 13/616; H03M 13/005;
(Continued)

(56) References Cited

U.S. PATENT DOCUMENTS

2004/0168112 A1 8/2004 Kim et al.
2005/0246615 A1* 11/2005 Matsumoto ........ H03M 13/1151
714/801

(Continued)

FOREIGN PATENT DOCUMENTS

EP 1 422 829 A2 5/2004
JP 2013-5124 A 1/2013

(Continued)

OTHER PUBLICATIONS

Wang, "Code Annealing and the Suppressing Effect of the Cyclically Lifted LDPC Code Ensemble", Information Theory Workshop, IEEE, IEEE, Piscataway, NJ, US, Oct. 1, 2006 (Oct. 1, 2006), pp. 86-90, XP031055498, ISBN: 978-1-4244-0067-6.*

(Continued)

*Primary Examiner* — April Y Blair
*Assistant Examiner* — Rong Tang
(74) *Attorney, Agent, or Firm* — Oblon, McClelland, Maier & Neustadt, L.L.P.

(57) ABSTRACT

A data structure of a check matrix for the error correction code is a data structure of a check matrix for an error correction code, in which the error correction code is the LDPC code, and in which the check matrix has a matrix structure in which rows are rearranged for submatrices consisting of a part of columns of the check matrix. Moreover, in the method and device for varying the coding rate of the error correction code, a puncture position that is determined in accordance with a puncture position determination signal is a puncture position with which a number of columns in which two or more 1s are contained in a region of the check matrix that is directly affected by puncturing is minimized.

20 Claims, 7 Drawing Sheets

(51) Int. Cl.
*H04L 1/00* (2006.01)
*H03M 13/03* (2006.01)

(52) U.S. Cl.
CPC ...... *H03M 13/116* (2013.01); *H03M 13/1154* (2013.01); *H03M 13/1185* (2013.01); *H03M 13/616* (2013.01); *H03M 13/6362* (2013.01); *H04L 1/0041* (2013.01); *H04L 1/0045* (2013.01)

(58) Field of Classification Search
CPC .......... H03M 13/116; H03M 13/1185; H03M 13/6362; H04L 1/0041; H04L 1/0045
See application file for complete search history.

(56) References Cited

U.S. PATENT DOCUMENTS

2010/0107033 A1* 4/2010 Kuri ................ H03M 13/1102
714/752
2014/0082452 A1 3/2014 Shinohara et al.

FOREIGN PATENT DOCUMENTS

WO WO 2008/093717 A1 8/2008
WO WO 2012/173061 A1 12/2012

OTHER PUBLICATIONS

Extended European Search Report dated Aug. 30, 2016 in Patent Application No. 13874449.5.
Zhengang Chen, et al., "Construction of Low-Density Parity-Check Convolutional Codes through Progressive Edge-Growth" IEEE Communications Letters, vol. 9, No. 12, XP001237858, Dec. 1, 2005, pp. 1058-1060.
Chih-Chun Wang, "Code Annealing and the Suppressing Effect of the Cyclically Lifted LDPC Code Ensemble" IEEE Information Theory Workshop, XP031055498, Oct. 1, 2006, pp. 86-90.
Milos Ivkovic, et al., "Eliminating Trapping Sets in Low-Density Parity-Check Codes by Using Tanner Graph Covers" IEEE Transactions on Information Theory, vol. 54, No. 8, XP011231438, Aug. 1, 2008, pp. 3763-3768.
Reza Asvadi, et al., "Lowering the Error Floor of LDPC Codes Using Cyclic Liftings" IEEE Transactions on Information Theory, vol. 57, No. 4, XP011476996, Apr. 1, 2011, pp. 2213-2224.
Walter Nitzold, et al., "Spatially Coupled Protograph-Based LDPC Codes for Incremental Redundancy" IEEE 7th International Symposium on Turbo Codes and Iterative Information Processing (ISTC), XP032456384, Aug. 27, 2012, pp. 155-159.
Eoiyoung Choi, et al., "Rate-Compatible Puncturing for Low-Density Parity-Check Codes With Dual-Diagonal Parity Structure" IEEE 16$^{th}$ International Symposium on Personal, Indoor and Mobile Radio Communications, vol. 4, XP055131624, Jan. 1, 2005, pp. 2642-2646.
International Search Report dated Mar. 19, 2013, in PCT/JP2013/053047, filed Feb. 8, 2013.
Shrinivas Kudekar, et al., "Threshold Saturation on BMS Channels via Spatial Coupling", CORR, Apr. 21, 2010, 5 pages.
Shrinivas Kudekar, et al., "Threshold Saturation via Spatial Coupling: Why Convolutional LDPC Ensembles Perform so well over the BEC", IEEE Transactions on Information Theory, Oct. 26, 2010, 29 pages.
Kenta Kasai, et al., "Spatially-Coupled MacKay-Neal codes and Hsu-Anastasopoulos codes", IEEE International Symposium on Information Theory Proceedings, Aug. 5, 2011, pp. 747-751.
Hironori Uchikawa, et al., "Performance and Construction of Rate-Compatible Non-Binary LDPC Convolutional Codes", Institute of Electronics, Information, and Communication Engineers, IEICE Technical Report, vol. 110, No. 205, Sep. 14, 2010, pp. 19-24.
Toshinori Suzuki, et al., "A Puncturing Method for Irregular Low-Density Parity-Check Codes", Institute of Electronics, Information, and Communication Engineers, Mar. 7, 2005, 2 pages.
Charly Poulliat, et al., "Design of Regular $(2,d_c)$-LDPC Codes over GF(q) Using Their Binary Images", IEEE Transactions on Communications, vol. 56, No. 10, Oct. 2008, pp. 1626-1635.

* cited by examiner

FIG. 1

CYCLIC SHIFT →

$$\begin{pmatrix} 0 & \cdots & 0 & 1 & 0 & \cdots & 0 \\ 0 & \cdots & 0 & 0 & 1 & \cdots & 0 \\ \vdots & & \vdots & & \vdots & \ddots & 0 \\ 0 & 0 & 0 & 0 & 0 & 0 & 1 \\ 1 & 0 & 0 & 0 & 0 & 0 & 0 \\ & \ddots & & & 0 & 0 & \vdots \\ 0 & & 1 & 0 & 0 & \cdots & 0 \end{pmatrix}$$

FIG. 2

□ : CYCLIC PERMUTATION MATRIX
(MATRIX OBTAINED BY CYCLICALLY SHIFTING UNIT MATRIX)

PARITY CHECK MATRIX
FOR SPATIALLY-COUPLED LDPC CODE

FIG. 12

TRANSMITTER AND RECEIVER, AND METHOD OF VARYING A CODING RATE

TECHNICAL FIELD

The present invention relates to a data structure of a check matrix for an error correction code, and a method and device for varying a coding rate of the error correction code.

BACKGROUND ART

An error correction code is a technology used in a communication system, a broadcasting system, a storage apparatus, and the like. More specifically, the error correction code adds redundant bits to digital data for transmission or storage to allow, even when there is an error bit in received data or data read from a storage medium, the error to be corrected. Note, however, that the number of correctable error bits is limited, and the number of correctable error bits is different depending on error correction performance of the error correction code method.

In this field of art, data to be transmitted or stored is referred to as "information bits", and the redundant bits added to the information bits are referred to as "parity bits". The parity bits are calculated from the information bits by a calculation method that is different depending on the coding method of the error correction code. In addition, a bit string obtained by combining the information bits and the parity bits is referred to as "codeword".

An error correction code called "block code" calculates the parity bits from the information bits in units of a predetermined number of bits. In other words, the number of information bits and the number of parity bits in one codeword are predetermined and referred to as "information bit length" and "parity bit length", respectively. Moreover, the number of bits of the codeword is referred to as "code length".

In recent years, as the error correction code, a low-density parity-check (LDPC) code has been in wide use. The LDPC code is a block code defined by a sparse parity check matrix (hereinafter referred to as "check matrix") having a few non-zero elements.

In the specification of the present invention, each matrix element of the check matrix is 0 or 1. Moreover, the number of 1s contained in a column of the check matrix is referred to as "column weight". Moreover, each column of the check matrix corresponds to each bit forming the codeword. In other words, the number of columns of the check matrix is the code length. Moreover, in a case where the check matrix has full rank, the number of rows of the check matrix is equal to the parity bit length.

Figure 11:
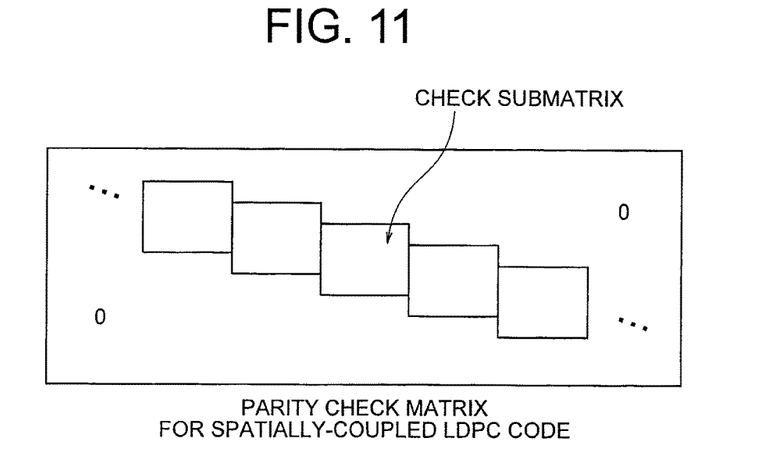
FIG. 11 is an explanatory diagram illustrating the check matrix for the spatially-coupled LDPC code.

Now, a spatially-coupled LDPC code defined by a check matrix as in FIG. 11, for example, has been theoretically analyzed and shown to have high error correction performance (see, for example, Non Patent Literature 1).

In FIG. 11, the outer enclosing rectangle indicates a check matrix for the spatially-coupled LDPC code, and the rectangles (check submatrices) therein indicate submatrices for the spatially-coupled LDPC code. Matrix elements in parts other than the rectangles indicating the check submatrices are all 0s. Note that, each check submatrix also serves as a check matrix by itself, and a large check matrix formed by diagonally coupling a plurality of the check submatrices as in FIG. 11 is the check matrix for the spatially-coupled LDPC code.

The theoretical analysis disclosed in Non Patent Literature 1 evaluates the error correction performance of the spatially-coupled LDPC code by using a numerical analysis method called "density evolution" under a condition that the check matrix has the structure as in FIG. 11. As a result of the analysis, the spatially-coupled LDPC code has been shown to have high error correction performance approaching the theoretical limit.

CITATION LIST

Non Patent Literature

[NPL 1] S. Kudekar, C. Measson, T. J. Richardson, and R. L. Urbanke, "Threshold Saturation on BMS Channels via Spatial Coupling", CoRR, 2010

SUMMARY OF INVENTION

Technical Problem

However, the related art has the following problem.

According to Non Patent Literature 1, the spatially-coupled LDPC code is shown to have the high error correction performance, but a specific configuration of the check matrix (that is, specific configuration of each check submatrix) or a configuration method for the check submatrices is not disclosed in Non Patent Literature 1. This is attributed to the nature of the density evolution evaluation method, that is, the fact that the method evaluates the error correction performance without giving any specific configuration of the check submatrices.

In a case where the spatially-coupled LDPC code is actually configured and put to practical use, a large difference occurs between error correction performance of the configured spatially-coupled LDPC code and the theoretical limit. This is attributed to the specific configuration of the check submatrices, among which an important factor is a closed-loop structure of the check matrix.

Figure 12:
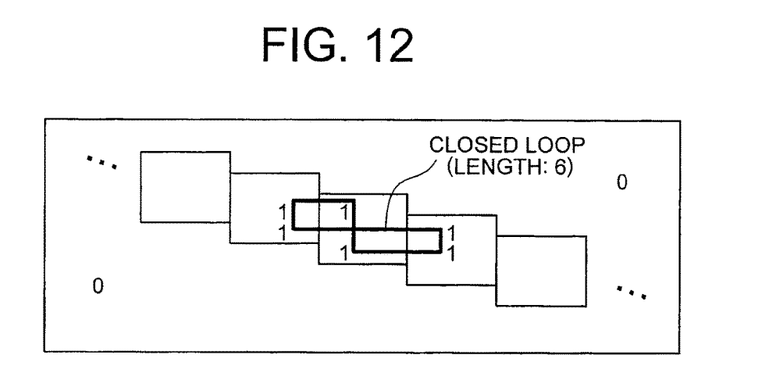
FIG. 12 is an explanatory diagram illustrating a problem in the check matrix for the spatially-coupled LDPC code.

For example, as in FIG. 12, a structure obtained by connecting positions of 1s in the check matrix by line segments to allow starting from an arbitrary 1 to follow the line segments back to the original position is referred to as "closed loop". The number of 1s forming the closed loop is referred to as "length" of the closed loop, and a short closed loop causes degradation in error correction performance of the spatially-coupled LDPC code. When the spatially-coupled LDPC code is put to practical use, a code length and the like are constrained due to cost requirements such as a circuit scale, and when the spatially-coupled LDPC code is configured under such constraints, many short closed loops are generated to degrade the error correction performance.

As described above, in the case where the spatially-coupled LDPC code is configured under the practical conditions, there is the problem in that the error correction performance is degraded due to the specific configuration of the check submatrices. One reason is the problem in that the error correction performance is degraded due to the short closed-loop structure of the check matrix.

The present invention has been made in order to solve the above-mentioned problem, and therefore has an object to provide, based on the spatially-coupled LDPC code, a transmitter and a receiver that have high error correction performance, and a method of varying a coding rate that realizes the high error correction performance.

Solution to Problem

In a data structure of a check matrix for an error correction code according to one embodiment of the present invention, the error correction code is an LDPC code, and the check matrix has a matrix structure in which rows are rearranged for submatrices consisting of a part of columns of the check matrix.

Moreover, a coding rate varying device for an error correction code according to one embodiment of the present invention includes: a puncture circuit for removing parity bits in accordance with a puncture position determination signal; and a depuncturing unit for depuncturing the punctured parity bits in accordance with the puncture position determination signal, in which a puncture position that is determined in accordance with the puncture position determination signal is a puncture position with which a number of columns in which two or more 1s are contained in a region of a check matrix that is directly affected by puncturing is minimized.

Moreover, a coding rate varying method for an error correction code according to one embodiment of the present invention includes: a puncture step of removing parity bits in accordance with a puncture position determination signal; and a depuncturing step of depuncturing the punctured parity bits in accordance with the puncture position determination signal, in which a puncture position that is determined in accordance with the puncture position determination signal is a puncture position with which a number of columns in which two or more is are contained in a region of a check matrix that is directly affected by puncturing is minimized.

Advantageous Effects of Invention

According to the data structure of the check matrix for the error correction code according to the one embodiment of the present invention, the error correction code is the LDPC code, and the check matrix has the matrix structure in which the rows are rearranged for the submatrices consisting of the part of columns of the check matrix.

Moreover, the method and device for varying the coding rate of the error correction code according to the one embodiment of the present invention include: the puncture circuit for (puncture step of) removing the parity bits in accordance with the puncture position determination signal; and the depuncturing unit for (depuncturing step of) depuncturing the punctured parity bits in accordance with the puncture position determination signal, in which the puncture position that is determined in accordance with the puncture position determination signal is the puncture position with which the number of columns in which two or more is are contained in the region of the check matrix that is directly affected by the puncturing is minimized.

Therefore, based on the spatially-coupled LDPC code, the transmitter and the receiver that have the high error correction performance, and the method of varying a coding rate that realizes the high error correction performance may be provided.

DESCRIPTION OF EMBODIMENTS

Now, a data structure of a check matrix for an error correction code, and a method and device for varying a coding rate of the error correction code according to preferred embodiments of the present invention are described with reference to the drawings, in which the same or corresponding parts are denoted by the same reference numerals for description.

First Embodiment

Calculating parity bits that enable error correction based on information bits to form a codeword is referred to as "error correction coding". A calculation procedure for the error correction coding is different for the error correction code method, but in an LDPC code and other such linear block codes, for example, the error correction coding is performed based on the data structure of the check matrix. Now, an example of the error correction coding method is described.

An information bit sequence is represented by d, the check matrix is represented by H, a parity bit sequence to be calculated is represented by p, and the codeword is represented by c, where d, p, and c are vectors, and one vector element corresponds to one bit. As described above, the codeword c consists of the information bit sequence d and the parity bit sequence p, and hence c may be expressed as: c=(d, p).

In a case of a linear block code, c and H have a relationship: $cH^T=0$, where $H^T$ represents a transposed matrix of H, and 0 represents a vector in which all elements are 0s. As described above, c=(d, p), and hence $(d, p)H^T=0$ holds. In order to calculate p based on known d and H using this expression, simultaneous linear equations with vector elements of p being variables may be solved. The simultaneous linear equations are equations based on the data structure of the check matrix H, and when solved by Gaussian elimination, for example, the parity bit sequence p may be calculated.

In a first embodiment of the present invention, a description is given of the data structure of the check matrix for the error correction code used in an error correction encoding device and a decoding device.

Figure 1:
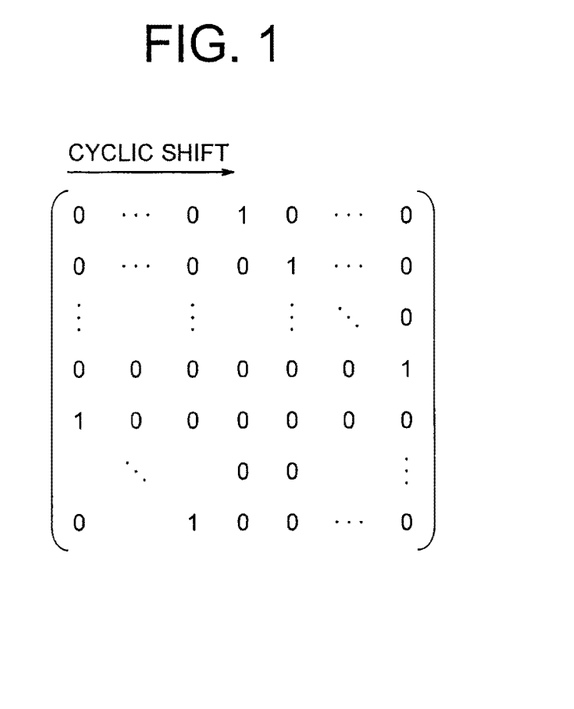
FIG. 1 is an explanatory diagram illustrating a cyclic permutation matrix obtained by cyclically shifting a unit matrix.

First, for the LDPC code, terms and definitions used in the description of the present invention are described. FIG. 1 is a matrix obtained by cyclically shifting a unit matrix and is called "cyclic permutation matrix". In FIG. 1, the term "cyclic shift" refers to an operation of inserting a column, which is displaced to the right of the matrix after the shift in a normal right shift, in the leftmost column of the matrix. In the cyclic shift, the number of columns to be shifted is referred to as "shift amount".

In a case where the check matrix for the LDPC code is represented by partitioned matrices (also generally referred to as "block matrices") with cyclic permutation matrices being check submatrices, the LDPC code is referred to as "quasi-cyclic (QC) LDPC code".

Figure 2:
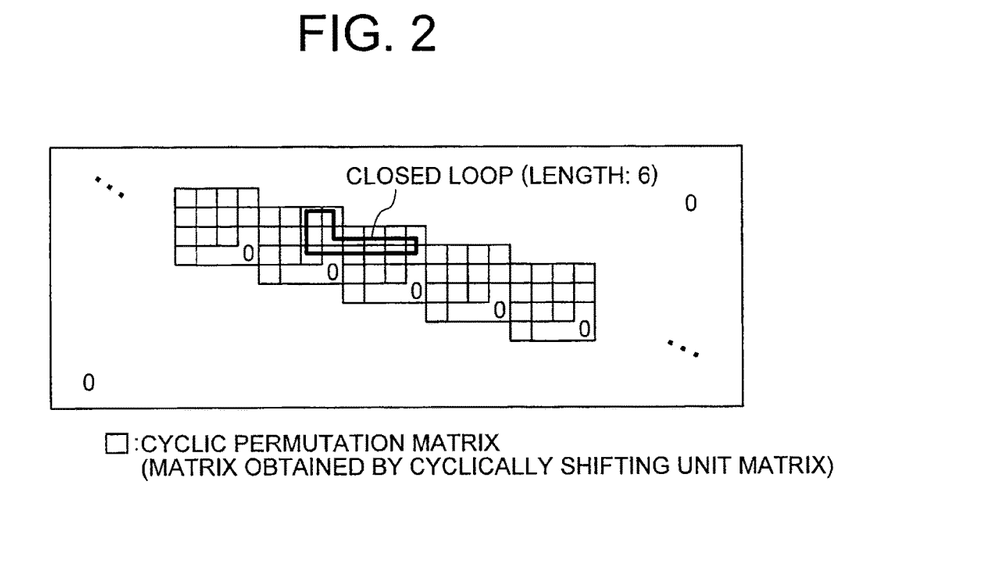
FIG. 2 is an explanatory diagram illustrating an example of a check matrix for a spatially-coupled LDPC code in which check submatrices consist of partitioned matrices of the cyclic permutation matrix.

FIG. 2 is an explanatory diagram illustrating an example of the check matrix for the spatially-coupled LDPC code in which the check submatrices consist of the partitioned matrices of the cyclic permutation matrix. In FIG. 2, the cyclic permutation matrices illustrated by small rectangles have different shift amounts, but some of the cyclic permutation matrices may have the same shift amounts. The QC LDPC code is relatively simple in terms of the configuration and circuit implementation of the check matrix, and is often used in practice.

When the spatially-coupled LDPC code is formed with the check matrices for the QC LDPC code being the check submatrices, a short closed loop, which causes a degradation in error correction performance, often occurs. This short closed loop is the closed loop as illustrated in FIG. 2, for example, and is generated because the shift amount has not been selected appropriately.

However, determining the shift amounts of the cyclic permutation matrices so as not to generate the short closed loop is difficult because the number of combinations is large, and is still a widely studied problem although many practical determining methods have been proposed. Therefore, in the first embodiment of the present invention, a change is made to the spatially-coupled QC LDPC code in terms of positions at which the cyclic permutation matrices are arranged to form the check matrix having a structure in which the closed loop is hardly generated.

Of the short closed loops, ones that especially cause the degradation in error correction performance are closed loops that contain a column having a small column weight. Moreover, as a proportion of columns having small column weights becomes larger, the error correction performance is more likely to be degraded. Such closed loops are likely to generate a structure called "trapping set", which degrades the error correction performance, and especially affects a degradation in error floor performance.

Figure 3:
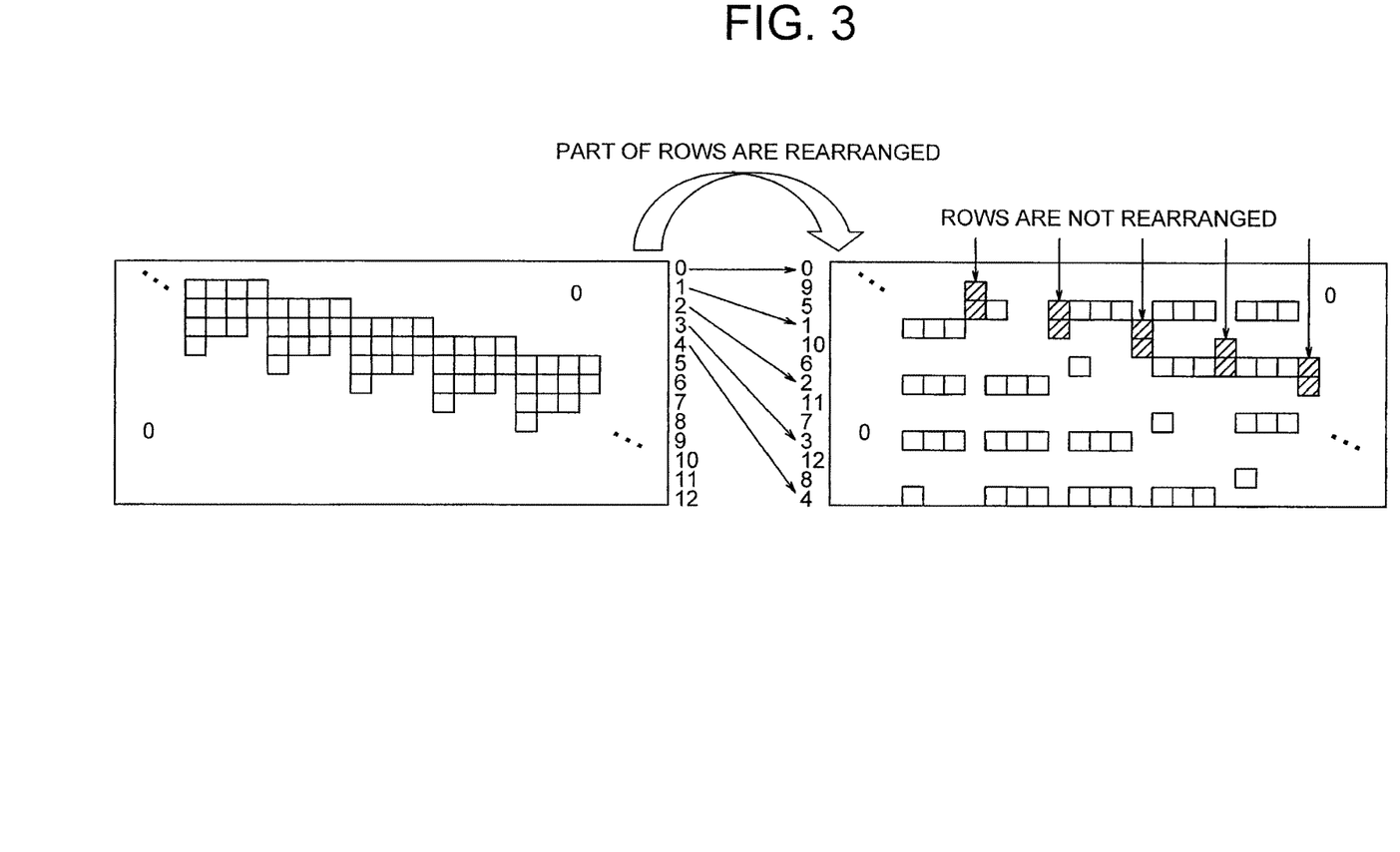
FIG. 3 is an explanatory diagram illustrating rearrangement of rows for a check matrix for a spatially-coupled QC LDPC code according to a first embodiment of the present invention.

In order to resolve such short closed loops containing the columns having the small column weights, a structure in which a part of the rows are rearranged for the check matrix for the spatially-coupled QC LDPC code is formed. FIG. 3 is an explanatory diagram illustrating the rearrangement of the rows for the check matrix for the spatially-coupled QC LDPC code according to the first embodiment of the present invention.

In FIG. 3, rows of submatrices consisting of columns having column weights of 3 or more are rearranged. Numbers written to the right of the matrix on the left side of FIG. 3 indicate row block numbers, and the rows are rearranged in units of a row block. Moreover, where each row block is rearranged in the matrix on the right side of FIG. 3 is indicated by the number and the arrow. As used herein, the term "row block" represents a set of rows obtained when the rows of the check matrix are divided with the number of rows corresponding to one cyclic permutation matrix being one unit. The row block numbers are counted in order from the top with the block number at the top of the matrix being 0.

Figure 4:
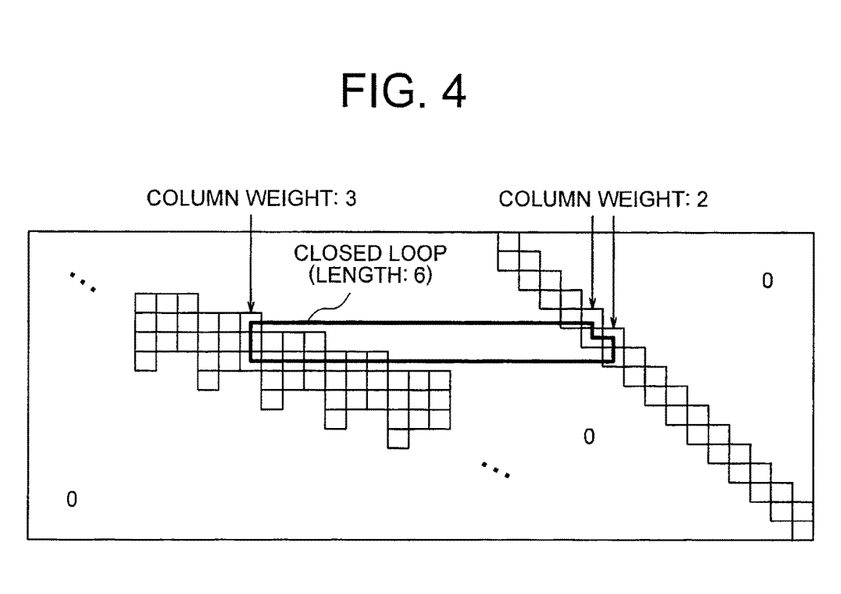
FIG. 4 is an explanatory diagram illustrating the check matrix before the rows of the spatially-coupled QC LDPC code are rearranged.
Figure 5:
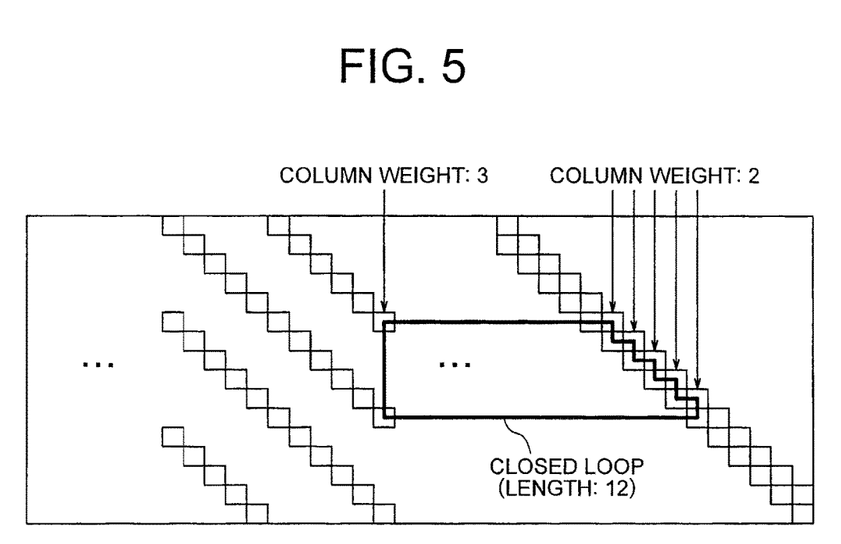
FIG. 5 is an explanatory diagram illustrating the check matrix after the rows of the spatially-coupled QC LDPC code are rearranged.

Now, referring to FIGS. 4 and 5, a description is given of how such a rearrangement of the rows resolves the short closed loop containing the columns having the small column weights. FIG. 4 is an explanatory diagram illustrating the check matrix before the rows of the spatially-coupled QC LDPC code are rearranged, and FIG. 5 is an explanatory diagram illustrating the check matrix after the rows of the spatially-coupled QC LDPC code are rearranged.

Note that, in FIG. 4, parts with a column weight of 2 are written so as to be gathered on the right side of the matrix. More specifically, the columns of the check matrix may be written as in FIG. 4 because, even when rearranged, the closed-loop structure and other such characteristics and the error correction performance of the LDPC code do not change. Moreover, in FIG. 5, only columns having column weights of 2 and 3 are written.

The closed loop having a length of 6 illustrated in FIG. 4 consists of one column having the column weight of 3 and two columns having the column weight of 2, and is a big factor that degrades the error correction performance. To the contrary, in the check matrix in which the rows have been rearranged as in FIG. 5, there is no way that the closed loop which has the length of 6 and consists of the one column having the column weight of 3 and the two columns having the column weight of 2 illustrated in FIG. 4 could exist.

In other words, the closed loop which contains only one column having the column weight of 3 and in which the remaining columns are the columns having the column weight of 2 is the closed loop having the structure illustrated in FIG. 5, and in this example, has a length of at least 12. Therefore, the length of the closed loop may be made longer than 6 to resolve the degradation in error correction performance. As described above, arrangements of the cyclic permutation matrices that have been next to each other in FIG. 3 may be separated by the rearrangement of the rows to resolve the short closed loop.

Figure 6:
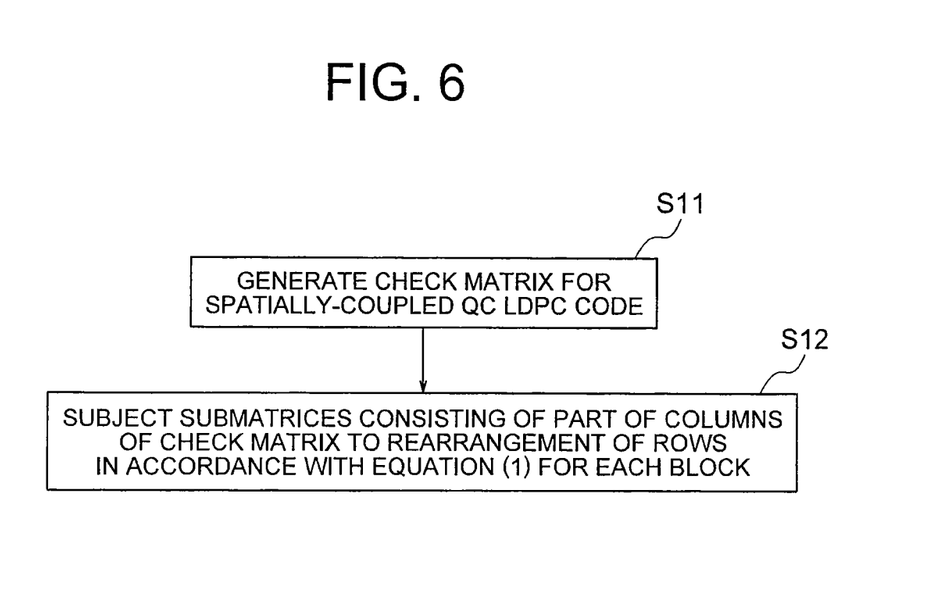
FIG. 6 is a flow chart illustrating a procedure of the rearrangement of the rows for the check matrix for the spatially-coupled QC LDPC code according to the first embodiment of the present invention.

Next, referring to a flow chart of FIG. 6, a description is given of a procedure of the rearrangement of the rows for the check matrix for the spatially-coupled QC LDPC code described above according to the first embodiment of the present invention.

First, the check matrix for the spatially-coupled QC LDPC code is generated (Step S11). In this case, the check matrix is generated with the use of a well-known conventional method, which includes progressive edge growth, for example.

Next, submatrices consisting of a part of columns of the check matrix generated in Step S11 are subjected to the rearrangement of the rows in accordance with a rule of the following equation (1) (Step S12).

$$y = ax \bmod m \qquad (1)$$

Note that, in the equation (1), x represents a row block number before the rearrangement, y represents a row block number after the rearrangement, m represents the total number of row blocks, and a represents an integer that is coprime to m.

In this case, the submatrices subjected to the rearrangement of the rows may be submatrices consisting of the above-mentioned columns having the column weights of 3 or more, or may be other submatrices. For example, in a case where there is no column having the column weight of 2 in the check matrix generated in Step S11, submatrices consisting of columns having column weights of 4 or more may be subjected to the rearrangement. Alternatively, submatrices consisting of columns of a value obtained by adding 1 to a value of the smallest column weight in the check matrix or more, or columns of a value obtained by adding a value more than 1 to the value of the smallest column weight or more may be subjected to the rearrangement.

On the other hand, in contrast to the above description, submatrices consisting of columns having column weights of a certain value or less may be subjected to the rearrangement. In any case, the submatrices to be subjected to the rearrangement may be set with the column weight being used as a reference to resolve the closed loop consisting of the columns having the small column weights.

Moreover, without limiting to the column weight used as the reference, submatrices may be selected by another method. For example, the short closed loop is generated in the check matrix for the spatially-coupled QC LDPC code because the cyclic permutation matrices are congested, and there is a possibility that the congestion may be resolved by the rearrangement of the rows to reduce the short closed loops.

Moreover, on the right side of the above-mentioned equation (1), x and m are determined at a time when the check matrix is generated in Step S11. The remaining a is an integer of 1 or more that is coprime to m. In other words, a is 1 or more and smaller than m, and is a number that is not a divisor of m. In this manner, when x takes a value from 0 to m−1, y also takes a value from 0 to m−1, and the value of y does not overlap for two or more x's.

A specific example of the above-mentioned equation (1) is expressed as the following equation (2). The equation (2) indicates the rearrangement rule used in the example of FIG. 3 described above.

$$y = 3x \bmod 13 \qquad (2)$$

Further, an equation that defines the above-mentioned a is expressed as the following equation (3).

[Math. 1]

$$a = \left\lfloor \frac{m}{w} \right\rfloor \qquad (3)$$

Note that, w on the right side of the equation (3) represents the column weight of the submatrices to be subjected to the rearrangement of the rows. Moreover, on the right side of the equation (3), a value obtained by dropping the fractional portion of a value obtained by dividing m by w is written in mathematical symbols.

In this case, a may be defined based on the equation (3) to efficiently resolve the congestion of the cyclic permutation matrices in the check matrix for the spatially-coupled QC LDPC code. More specifically, with a obtained by the equation (3), when the rearrangement of the rows is performed on the submatrices consisting of the columns having the column weights of 3 or more as illustrated in FIG. 5, the closed loop which contains only one column having the column weight of 3 and in which all the other columns contained therein have the column weight of 2 has a length of at least 2a+2.

As described above, the rows of the submatrices of the check matrix for the spatially-coupled QC LDPC code may be rearranged to resolve the short closed loop in the check matrix and hence improve the error correction performance.

Moreover, a communication system, a broadcasting system, and a storage apparatus including the LDPC code having the check matrix to which row rearrangement means is applied may be configured to improve the error correction performance.

Further, in Step S11, in generating the check matrix for the spatially-coupled QC LDPC code, when the density evolution or the like is used to optimize the values of the column weights and a distribution thereof, for example, and hence improve the error correction performance, it is possible to obtain a configuration in which the error correction performance after performing Step S12 is also high.

Further, in the above description, the check matrix for the spatially-coupled QC LDPC code is generated and then the rows are rearranged, but the rearrangement of the rows in Step S12 may be performed before determining the specific values of the shift amount and the like of each cyclic permutation matrix. In this case, a step of determining the shift amount is needed after Step S12.

This eliminates the need to take into consideration a closed loop that is newly generated by the rearrangement of the rows in Step S12, and hence more short closed loops may be resolved to form the check matrix having the high error correction performance.

Moreover, the check matrix having the configuration in which the submatrices consisting of the columns having the column weight of 2 are arranged in a stair-step shape as illustrated in FIG. 5 may be used to obtain an effect that the parity bits may be calculated with a small amount of operation.

Second Embodiment

In a second embodiment of the present invention, a description is given of a method and device that realize varying a coding rate of the LDPC code having the check matrix of the data structure in the first embodiment described above.

The coding rate is a value expressed by an information bit length divided by a code length. As the coding rate becomes larger, a proportion of the parity bits to all bits to be transmitted by a transmitter and a redundancy become smaller, but the error correction performance becomes lower. To the contrary, as the coding rate becomes smaller, the proportion of the parity bits and the redundancy become larger, but the error correction performance becomes higher. Taking such a relationship into account, it is useful to make the coding rate changeable as needed depending on the system that uses the error correction code and its operating environment.

Figure 7:
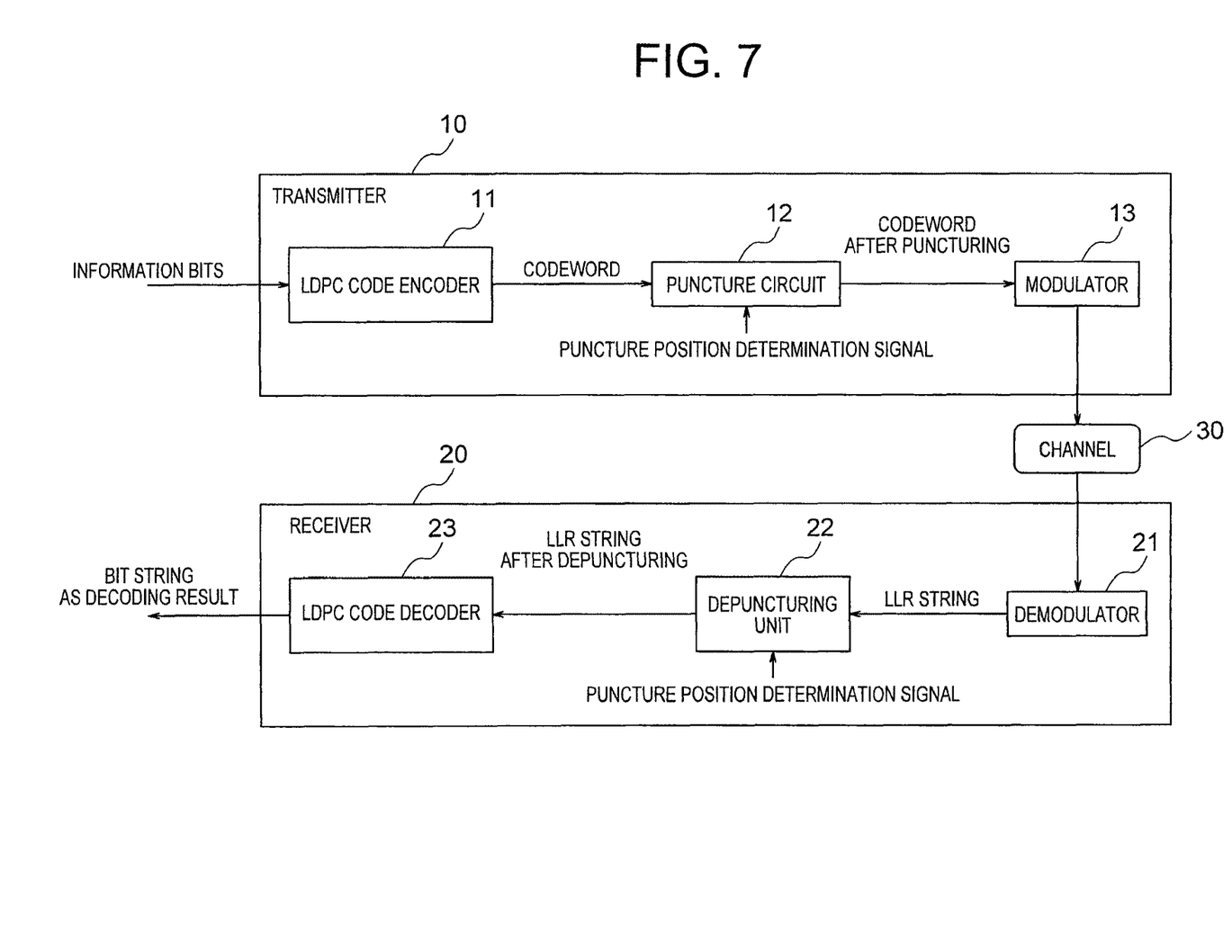
FIG. 7 is an explanatory diagram in a case where a coding rate varying device for an error correction code having a puncture function according to a second embodiment of the present invention is applied to a communication system.

Now, a related-art method of changing the coding rate includes puncturing of the parity bits. The puncturing removes and does not transmit a part of the calculated parity bits to change the coding rate. FIG. 7 is an explanatory diagram in a case where a coding rate varying device for an error correction code having a puncture function according to the second embodiment of the present invention is applied to a communication system.

In FIG. 7, in the communication system, a transmitter 10 and a receiver 20 are connected to each other via a channel 30. The transmitter 10 includes an LDPC code encoder 11, a puncture circuit 12, and a modulator 13, and the receiver 20 includes a demodulator 21, a depuncturing unit 22, and an LDPC code decoder 23.

On information bits input to the transmitter 10, the LDPC code encoder 11 performs LDPC encoding to output a codeword.

The puncture circuit 12 determines positions in the codeword of parity bits to be punctured in accordance with a puncture position determination signal. Then, the puncture circuit 12 removes the parity bits at the determined positions from the codeword to output the codeword after the puncturing. In this case, the number of parity bits to be punctured may be any number, and may be configured with an arbitrary number.

The modulator 13 converts the codeword after the puncturing into a transmission signal such as a radio wave, light, or an electric signal to be transmitted to the channel 30. The transmitted signal travels the channel 30 to be received by the receiver 20.

The demodulator 21 calculates a log-likelihood ratio (LLR) string based on the received signal and outputs the calculated LLR string. The LLR is a value defined for each bit, and indicates whether the bit is 0 or 1 as well as its likelihood.

For example, when the LLR is a positive value and has a large absolute value, this indicates that the bit is likely to be 0, and when the LLR is a negative value and has a small absolute value, it indicates that the bit is likely to be 1. Moreover, in a case where the LLR is 0, it indicates that there is no information on whether the bit is 0 or 1. Note that, the correspondence of 0 and 1 with the sign may be opposite to the description.

The depuncturing unit 22 performs depuncturing. At this time, the parity bits that have been punctured have not been transmitted from the transmitter 10, and hence the receiver 20 has no information on those bits.

Therefore, the depuncturing unit 22 sets LLRs corresponding to the punctured parity bits to 0s, inserts 0s in appropriate positions of the input LLR string in accordance with the puncture position determination signal, and outputs the LLR string after the depuncturing. In this case, the positions at which 0s are inserted in the LLR string need to be the same as the parity bit positions at which the puncturing has been performed in the puncture circuit 12.

Note that, the LLRs do not always need to be set to 0s. In a case where the information bits, the transmitter, the channel, and the like have characteristics, tendencies, and the like, and a tendency of the parity bits punctured in the puncture circuit 12 is previously known, the LLRs to be set in the depuncturing unit 22 may be changed accordingly. For example, if the punctured parity bits tend to be 1, the LLRs set in the depuncturing unit 22 may be negative values.

The LDPC code decoder 23 uses the LLR string after the depuncturing to decode the LDPC code, and outputs a bit string as a decoding result.

Next, a description is given of a method of determining the puncture position in the puncture circuit 12 and the depuncturing unit 22. The puncture position affects the error correction performance, and depending on the position, the error correction performance may be degraded significantly. Moreover, depending on the structure of the check matrix, no matter which position is punctured, the significant degradation in error correction performance may occur. In other words, there has been a problem in that the method and device for varying the coding rate of the error correction code having the puncture function degrade the error correction performance.

Figure 8:
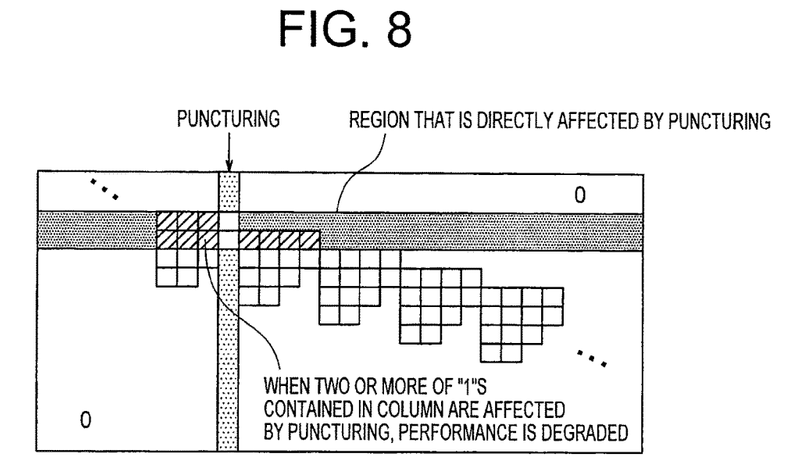
FIG. 8 is an explanatory diagram illustrating a degradation in error correction performance in puncturing for a general check matrix for the spatially-coupled QC LDPC code.

Therefore, first, for the general check matrix for the spatially-coupled QC LDPC code illustrated in FIG. 8, a cause of degrading the error correction performance in the puncturing is described. In FIG. 8, a case where the puncturing is performed on the bits corresponding to the columns indicated by "puncturing" is described as an example.

In the decoding in the LDPC code, an operation is performed for positions at which the matrix elements in the check matrix are 1s. Therefore, the puncturing has a large effect on the decoding of the punctured columns and the rows in the columns having the matrix elements of 1s. In FIG. 8, the latter is indicated as "region that is directly affected by puncturing".

More specifically, parts where the matrix elements are is inside this region are greatly affected by the puncturing. When many of is contained in one column of the check matrix are contained in such a region, the error correction performance for the bits corresponding to the column is degraded. In the spatially-coupled LDPC code, the positions of is are relatively congested, and hence when the puncturing is performed, many bits are degraded in terms of the error correction performance.

Figure 9:
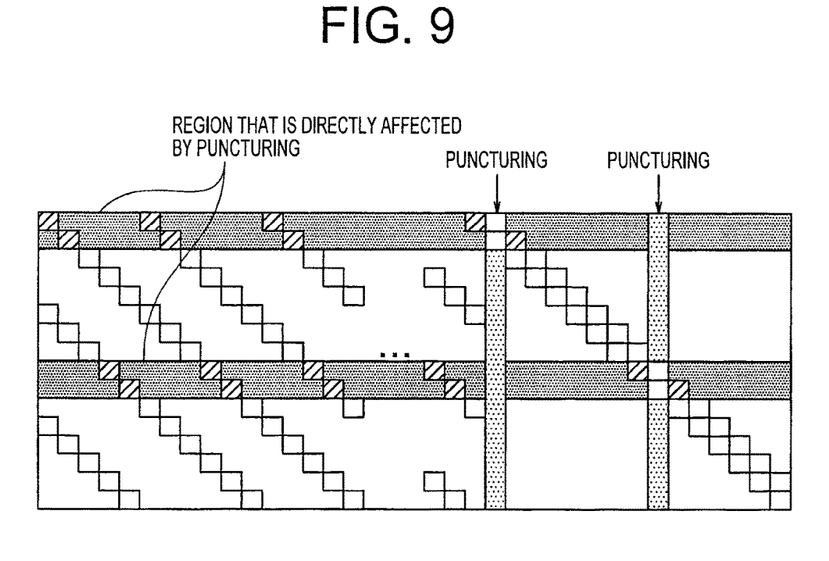
FIG. 9 is an explanatory diagram illustrating the error correction performance in the puncturing for the data structure of the check matrix for the LDPC code according to the first embodiment of the present invention.

On the other hand, in the data structure of the check matrix for the LDPC code described in the first embodiment of the present invention, as illustrated in FIG. 9, the positions of 1s in the check matrix are sparse, and hence the puncture position may be determined so as not to generate the column containing many 1s inside the region that is directly affected by the puncturing.

Figure 10:
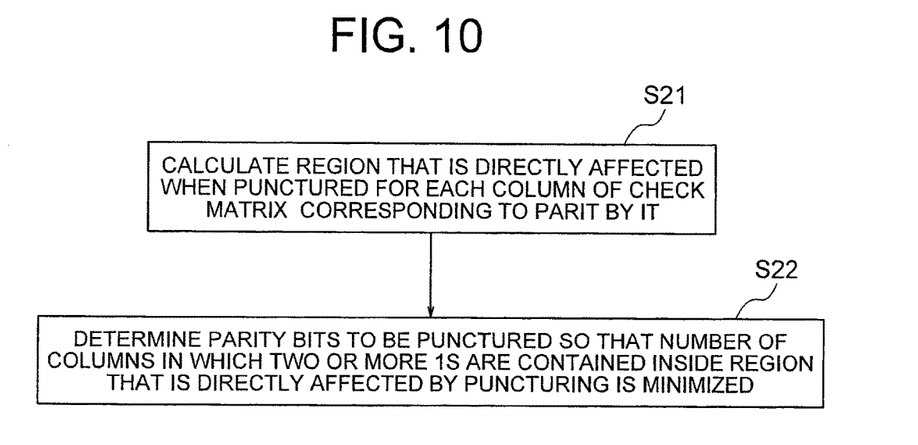
FIG. 10 is a flow chart illustrating a puncture position determining procedure according to the second embodiment of the present invention.

Next, referring to a flow chart of FIG. 10, a description is given of a puncture position determining procedure according to the second embodiment of the present invention.

First, for each parity bit, the region in the check matrix that is directly affected if punctured is calculated (Step S21).

Subsequently, using the region calculated in Step 21, the parity bits to be punctured are determined so that the number of columns in which two or more 1s are contained inside the region that is directly affected by the puncturing is minimized (Step S22). In other words, the puncture position is determined so that fewer bits are degraded in terms of the error correction performance.

Note that, in Step S22, the columns in which two or more 1s are contained in the region that is affected by the puncturing are minimized, but the number of 1s is not limited to two or more. Further, the determination may be made based not on the number but on the proportion, and the puncture position may be determined so that columns in which more than half of is contained therein are contained in the region that is affected by the puncturing are minimized.

In any case, with a method of determining the puncture position so as to reduce columns in which a plurality of 1s are contained in the region that is directly affected by the puncturing, the effect of the second embodiment of the present invention may be obtained.

The puncture position may be determined as described above to reduce the number of bits that are degraded in terms of the error correction performance, and hence the degradation in error correction performance of the LDPC code by the puncturing may be reduced.

Moreover, for the check matrix having the data structure in the first embodiment described above, the puncture position determining method according to the second embodiment of the present invention described above may be used to further reduce the number of bits that are degraded in terms of the error correction performance and reduce the degradation in error correction performance of the LDPC code due to the puncturing.

Moreover, with the communication system including the puncture position determining method as described above to allow the coding rate to be varied, the degradation in error correction performance of the LDPC code due to the puncturing may be reduced. Further, the communication system may be applied to the LDPC code of the check matrix in the first embodiment described above to further reduce the degradation in error correction performance of the LDPC code due to the puncturing.

Note that, the puncture position may be determined in advance, and information on the determined position may be embedded in a device. Moreover, a plurality of puncture positions including a mode in which the puncturing is not performed and other such modes may be embedded in the device in advance, and control and switching are performed in response to the puncture position determination signal to allow the puncture position to be varied. This allows the puncture function to be equipped in the device in a small circuit scale.

Moreover, in the second embodiment described above, the example of the device in the communication system has been described, but without limiting thereto, the present invention may be applied to the broadcasting system or the storage apparatus to obtain similar effects.

REFERENCE SIGNS LIST 10 transmitter, 11 LDPC code encoder, 12 puncture circuit, 13 modulator, 20 receiver, 21 demodulator, 22 depuncturing unit, 23 LDPC code decoder, 30 channel

The invention claimed is:

1. A transmitter for a communication system, the transmitter comprising:
   circuitry configured to:
      receive information bits to be transmitted over a wireless channel,
      generate, based on the information bits to be transmitted, a codeword of a low-density parity-check (LDPC) code containing parity bits,
      reduce degradations in error correction performance of the LDPC code by rearranging, as a function of a row block number, a total number of row blocks and an integer corresponding to the total number of row blocks, rows of submatrices consisting of a part of columns of a check matrix of the LDPC code, the rearrangement being performed based on a weight of each column to generate a matrix structure having a reduced number of closed loops having lengths shorter than a threshold length, a length of a closed loop being based on a weight of each column within the closed loop, wherein the communication system includes the LDPC code having the matrix structure to which the rearrangement is applied, and
      modulate the codeword into a transmission signal, and transmit the transmission signal over the wireless channel to a receiver.

2. The transmitter according to claim 1, wherein the weight is a number of is contained in the column.

3. The transmitter according to claim 2, wherein the weight is 3.

4. The transmitter according to claim 1,
   wherein the circuitry is configured to remove the parity bits contained in the generated codeword in accordance with a determined puncture position,
   wherein the puncture position minimizes a number of columns in which two or more 1s are contained in a region that is are directly affected by the removal of the parity bits of the check matrix of the LDPC code.

5. The transmitter according to claim 2, wherein the circuitry is configured to remove the parity bits contained in the generated codeword in accordance with a determined puncture position,
   wherein the puncture position minimizes a number of columns in which two or more 1s are contained in a region that is are directly affected by the removal of the parity bits of the check matrix of the LDPC code.

6. The transmitter according to claim 3, wherein the circuitry is configured to remove the parity bits contained in the generated codeword in accordance with a determined puncture position,
   wherein the puncture position minimizes a number of columns in which two or more is are contained in a region that is directly affected by the removal of the parity bits of the check matrix of the LDPC code.

7. A receiver for a communication system, the receiver comprising:
   circuitry configured to:
      receive a signal that has been transmitted by a transmitter over a wireless channel,
      demodulate the received signal, the signal being obtained by modulating a codeword being generated by encoding of a low-density parity-check (LDPC) code and containing parity bits; and
      decode the LDPC code based on the received demodulated signal to reproduce a bit string that corresponds to information bits originally received at the transmitter,
      wherein a check matrix of the LDPC code having a closed loop has a matrix structure in which rows of submatrices consisting of a part of columns of the check matrix are rearranged, to reduce degradations in error correction performance of the LDPC code, as a function of a row block number, a total number of row blocks and an integer corresponding to the total number of row blocks, the rearrangement being performed based on a weight of each column to generate the matrix structure having a reduced number of closed loops having lengths shorter than a threshold length, a length of the closed loop being based on a weight of each column within the closed loop, wherein the communication system includes the LDPC code having the matrix structure to which the rearrangement is applied.

8. The receiver according to claim 7, wherein the weight is a number of is contained in the column.

9. The receiver according to claim 8, wherein the weight is 3.

10. The receiver according to claim 7,
    wherein the received signal includes a signal that is received after having been transmitted, the signal being obtained by removing the parity bits contained in the codeword by puncturing,
    wherein the receiver is further configured to depuncture, for the demodulated received signal, the parity bits removed by the puncturing in accordance with a determined puncture position, and wherein the puncture position minimizes a number of columns in which two or more is are contained in a region that is directly affected by the removal of the parity bits of the check matrix of the LDPC code.

11. The receiver according to claim 8, wherein the received signal includes a signal that is received after having been transmitted, the signal being obtained by removing the parity bits contained in the codeword by puncturing, wherein the receiver is further configured to depuncture, for the demodulated received signal, the parity bits removed by the puncturing in accordance with a determined puncture position, and wherein the puncture position minimizes a number of columns in which two or more is are contained in a region that is directly affected by the removal of the parity bits of the check matrix of the LDPC code.

12. The receiver according to claim 9, wherein the received signal includes a signal that is received after having been transmitted, the signal being obtained by removing the parity bits contained in the codeword by puncturing, wherein the receiver is further configured to depuncture, for the demodulated received signal, the parity bits removed by the puncturing in accordance with a determined puncture position, and wherein the puncture position minimizes a number of columns in which two or more 1s are contained in a region that is directly affected by the removal of the parity bits of the check matrix of the LDPC code.

13. A method of varying a coding rate, which is to be executed by a transmitter for transmitting a signal encoded into a low-density parity-check (LDPC) code and a receiver for receiving the signal for a communication system, the method comprising:

at circuitry of the transmitter,
receiving information bits to be transmitted over a wireless channel;
generating based on the information bits to be transmitted, a codeword of the low-density parity-check (LDPC) code containing parity bits;
removing the parity bits of the codeword in accordance with a determined puncture position;
modulating the codeword into a transmission signal, and
transmitting the transmission signal over the wireless channel to the receiver; and depuncturing, via circuitry of the receiver, the parity bits removed by puncturing in accordance with the determined puncture position, wherein a check matrix of the LDPC code having a closed loop has a matrix structure in which rows of submatrices consisting of a part of columns of the check matrix are rearranged, to reduce degradations in error correction performance of the LDPC code, as a function of a row block number, a total number of row blocks and an integer corresponding to the total number of row blocks, the rearrangement being performed based on a weight of each column to generate the matrix structure having a reduced number of closed loops having lengths shorter than a threshold length, a length of the closed loop being based on a weight of each column within the closed loop, wherein the puncture position minimizes a number of columns in which two or more is are contained in a region that is directly affected by puncturing of the check matrix of the LDPC code and the communication system includes the LDPC code having the matrix structure to which the rearrangement is applied.

14. The method of varying a coding rate according to claim 13, wherein weight is a number of is contained in the column.

15. The method of varying a coding rate according to claim 14, wherein the weight is 3.

16. The transmitter according to claim 1, wherein the rows of submatrices consisting of a part of columns of the check matrix are rearranged as a function of columns having higher weight values.

17. The transmitter according to claim 1, wherein the rows of submatrices consisting of a part of the columns of the check matrix are rearranged as a function of rows having weight values greater than a predetermined threshold.

18. The transmitter according to claim 1, wherein the rows of submatrices are rearranged to lengthen the closed loop to enhance error correction performance.

19. The transmitter according to claim 1, wherein the integer corresponding to the total number of row blocks is an integer which is coprime to the total number of row blocks.

20. The transmitter according to claim 1, wherein the rows are rearranged based on:

$y = ax \bmod m$, wherein y is a row block number after rearrangement, x is the row block number before rearrangement, m is the total number of row blocks, and a is an integer that is coprime to m.

* * * * *